(12) United States Patent
Numakura et al.

(10) Patent No.: US 10,177,675 B2
(45) Date of Patent: Jan. 8, 2019

(54) ELECTRIC POWER CONVERSION DEVICE

(71) Applicant: Hitachi Automotive Systems, Ltd., Hitachinaka-shi, Ibraraki (JP)

(72) Inventors: Yuta Numakura, Hitachinaka (JP); Akira Ishii, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/540,587

(22) PCT Filed: Mar. 9, 2016

(86) PCT No.: PCT/JP2016/057266
§ 371 (c)(1),
(2) Date: Jun. 29, 2017

(87) PCT Pub. No.: WO2016/158259
PCT Pub. Date: Oct. 6, 2016

(65) Prior Publication Data
US 2018/0026545 A1 Jan. 25, 2018

(30) Foreign Application Priority Data
Mar. 31, 2015 (JP) ................. 2015-070623

(51) Int. Cl.
*H05K 7/02* (2006.01)
*H02M 7/00* (2006.01)
(Continued)

(52) U.S. Cl.
CPC ............ *H02M 7/003* (2013.01); *H02M 7/48* (2013.01); *H05K 7/02* (2013.01); *H05K 7/2089* (2013.01); *H05K 7/20845* (2013.01)

(58) Field of Classification Search
None
See application file for complete search history.

(56) References Cited

U.S. PATENT DOCUMENTS

2009/0231811 A1* 9/2009 Tokuyama ............. H01L 23/36
361/699
2010/0097765 A1* 4/2010 Suzuki .................. B60K 6/365
361/699
(Continued)

FOREIGN PATENT DOCUMENTS

JP 2012-178484 A 9/2012
JP 2013-27218 A 2/2013
(Continued)

OTHER PUBLICATIONS

International Search Report (PCT/ISA/210) issued in PCT Application No. PCT/JP2016/057266 dated Jun. 21, 2016 with English translation (5 pages).
(Continued)

Primary Examiner — Courtney Smith
(74) Attorney, Agent, or Firm — Crowell & Moring LLP

(57) ABSTRACT

An object of the present invention is to achieve reduction in height of an electric power conversion device while maintaining high performance of the electric power conversion device. An electric power conversion device according to the present invention includes: a first power semiconductor module, a second power semiconductor module, a third power semiconductor module, and an AC circuit body that transmits and detects U-phase, V-phase, and W-phase AC currents, and when a direction along an arrangement direction of the first power semiconductor module and the second power semiconductor module is defined as a first column, the third power semiconductor module and the AC circuit body are disposed along a second column being in a direction parallel to the first column, and the AC circuit body is disposed in a space that is in a direction orthogonal to the first column and faces the second power semiconductor
(Continued)

module, and is in a direction parallel to the second column and faces the third power semiconductor module.

3 Claims, 6 Drawing Sheets

(51) Int. Cl.
  *H02M 7/48* (2007.01)
  *H05K 7/20* (2006.01)

(56) References Cited

U.S. PATENT DOCUMENTS

| | | | | |
|---|---|---|---|---|
| 2011/0188204 A1* | 8/2011 | Horiuchi | ............... | H01L 23/473 |
| | | | | 361/702 |
| 2011/0261600 A1* | 10/2011 | Tachibana | ............. | H02M 7/003 |
| | | | | 363/131 |
| 2011/0299265 A1* | 12/2011 | Nakatsu | .................. | B60L 11/14 |
| | | | | 361/820 |
| 2013/0265724 A1* | 10/2013 | Kaneko | .................. | H01L 21/50 |
| | | | | 361/715 |
| 2013/0278194 A1* | 10/2013 | Numakura | .............. | B60L 3/003 |
| | | | | 318/400.27 |
| 2013/0328185 A1 | 12/2013 | Hiramitsu et al. | | |
| 2014/0126154 A1* | 5/2014 | Higuchi | .............. | B60L 11/1803 |
| | | | | 361/714 |
| 2014/0140119 A1* | 5/2014 | Shinohara | ............. | H02M 7/003 |
| | | | | 363/141 |
| 2014/0160822 A1* | 6/2014 | Kuwano | ............... | H02M 7/003 |
| | | | | 363/141 |
| 2014/0313806 A1* | 10/2014 | Shinohara | .......... | H05K 7/20927 |
| | | | | 363/141 |

FOREIGN PATENT DOCUMENTS

| | | |
|---|---|---|
| JP | 2013-105882 A | 5/2013 |
| JP | 2013-233052 A | 11/2013 |
| JP | 2014-171343 A | 9/2014 |

OTHER PUBLICATIONS

Japanese-language Written Opinion (PCT/ISA/237) issued in PCT Application No. PCT/JP2016/057266 dated Jun. 21, 2016 (3 pages).

* cited by examiner

ELECTRIC POWER CONVERSION DEVICE

TECHNICAL FIELD

The present invention relates to an electric power conversion device for converting DC power to AC power or converting AC power to DC power, and in particular relates to an electric power conversion device suitable for being mounted on a vehicle.

BACKGROUND ART

A hybrid car and an electric car are each provided with an electric power conversion device for driving and controlling a drive motor. The electric power conversion device is disposed at various positions of a vehicle, and depending on the disposed position, it is required to be made smaller in the height direction of the electric power conversion device, or it is required to be made smaller in the width direction of the electric power conversion device. A typical case of the former is that the electric power conversion device is disposed directly below the driver's seat or the assistant driver's seat.

In JP 2013-027218 A (PTL 1), three power semiconductor modules are arranged in a line, whereby reduction in height of the electric power conversion device is achieved.

In an electric power conversion device described in JP 2013-233052 A (PTL 2), two power semiconductor modules are arranged in a line and a remaining one power semiconductor module is disposed above the two power semiconductor modules.

In the electric power conversion devices described in PTL 1 and PTL 2, achieving reduction in height of the electric power conversion device while maintaining high performance of the electric power conversion device has not been sufficiently considered.

CITATION LIST

Patent Literature

PTL 1: JP 2013-027218 A
PTL 2: JP 2013-233052 A

SUMMARY OF INVENTION

Technical Problem

An electric power conversion device according to the present invention is to achieve reduction in height of the electric power conversion device while maintaining high performance of the electric power conversion device.

Solution to Problem

The electric power conversion device according to the present invention includes: a first power semiconductor module that outputs a U-phase AC current; a second power semiconductor module that outputs a V-phase AC current; a third power semiconductor module that outputs a W-phase AC current; and an AC circuit body that transmits and detects the U-phase AC current, the V-phase AC current, and the W-phase AC current, and when a direction along an arrangement direction of the first power semiconductor module and the second power semiconductor module is defined as a first column, the third power semiconductor module and the AC circuit body are disposed along a second column being in a direction parallel to the first column, and the AC circuit body is disposed in a space that is in a direction orthogonal to the first column and faces the second power semiconductor module, and is in a direction parallel to the second column and faces the third power semiconductor module.

Advantageous Effects of Invention

With the present invention, reduction in height of the electric power conversion device can be achieved while maintaining high performance of the electric power conversion device.

DESCRIPTION OF EMBODIMENT

An embodiment according to the present invention will be described with reference to the drawings.

Figure 1:
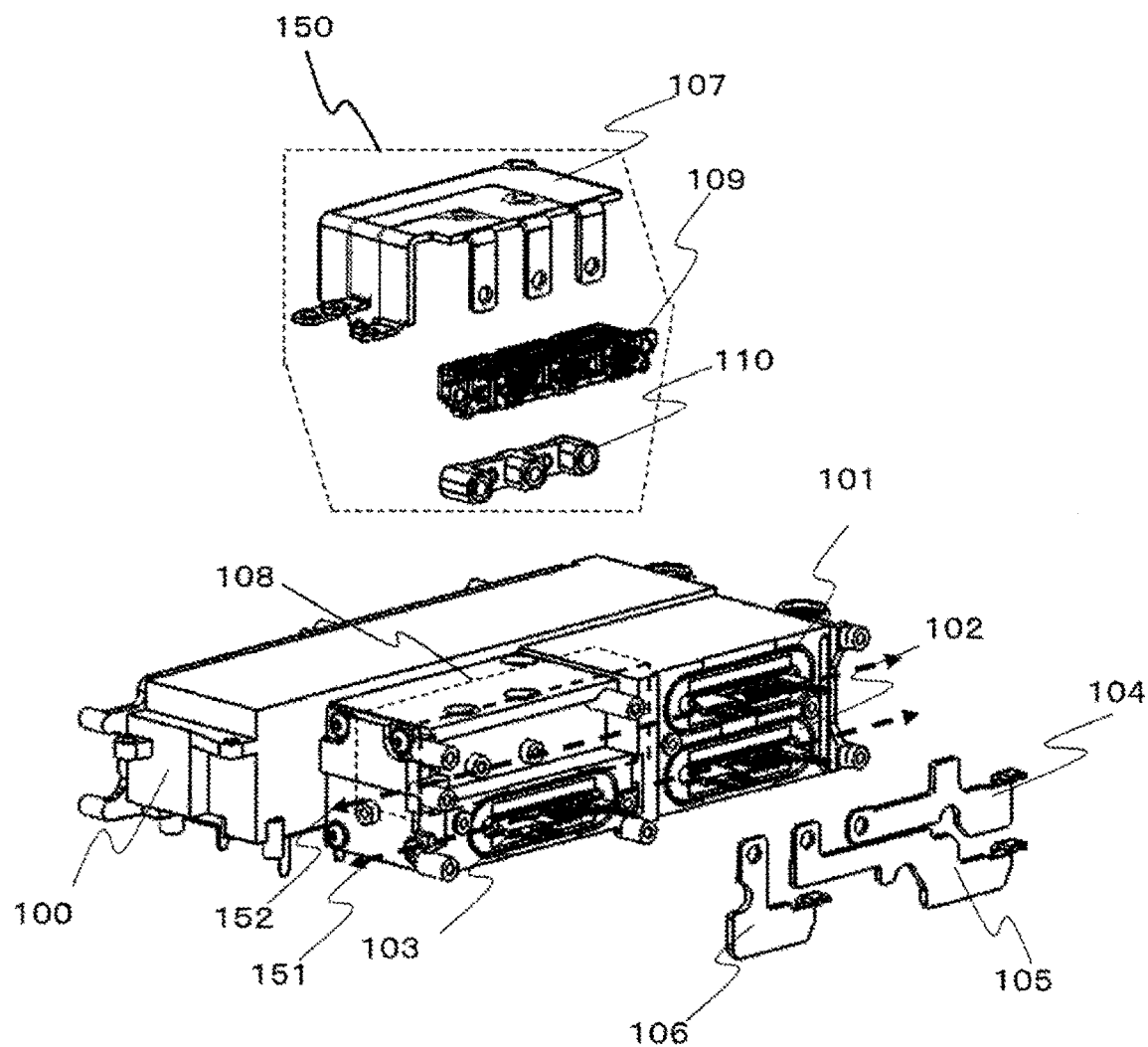
FIG. 1 is an exploded perspective view related to an AC circuit body 150, a first AC relay bus bar 104, a second AC relay bus bar 105, a third AC relay bus bar 106, and other components among internal components of an electric power conversion device according to a present embodiment.
Figure 2:
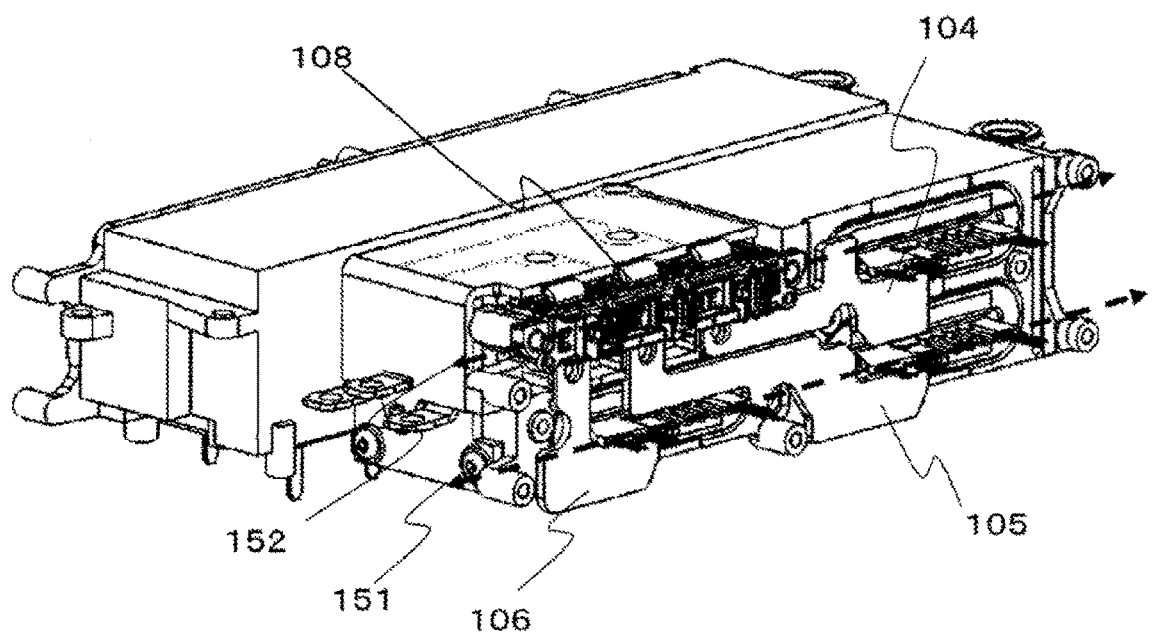
FIG. 2 is a perspective view of the internal components of the electric power conversion device illustrated in FIG. 1.
Figure 3:
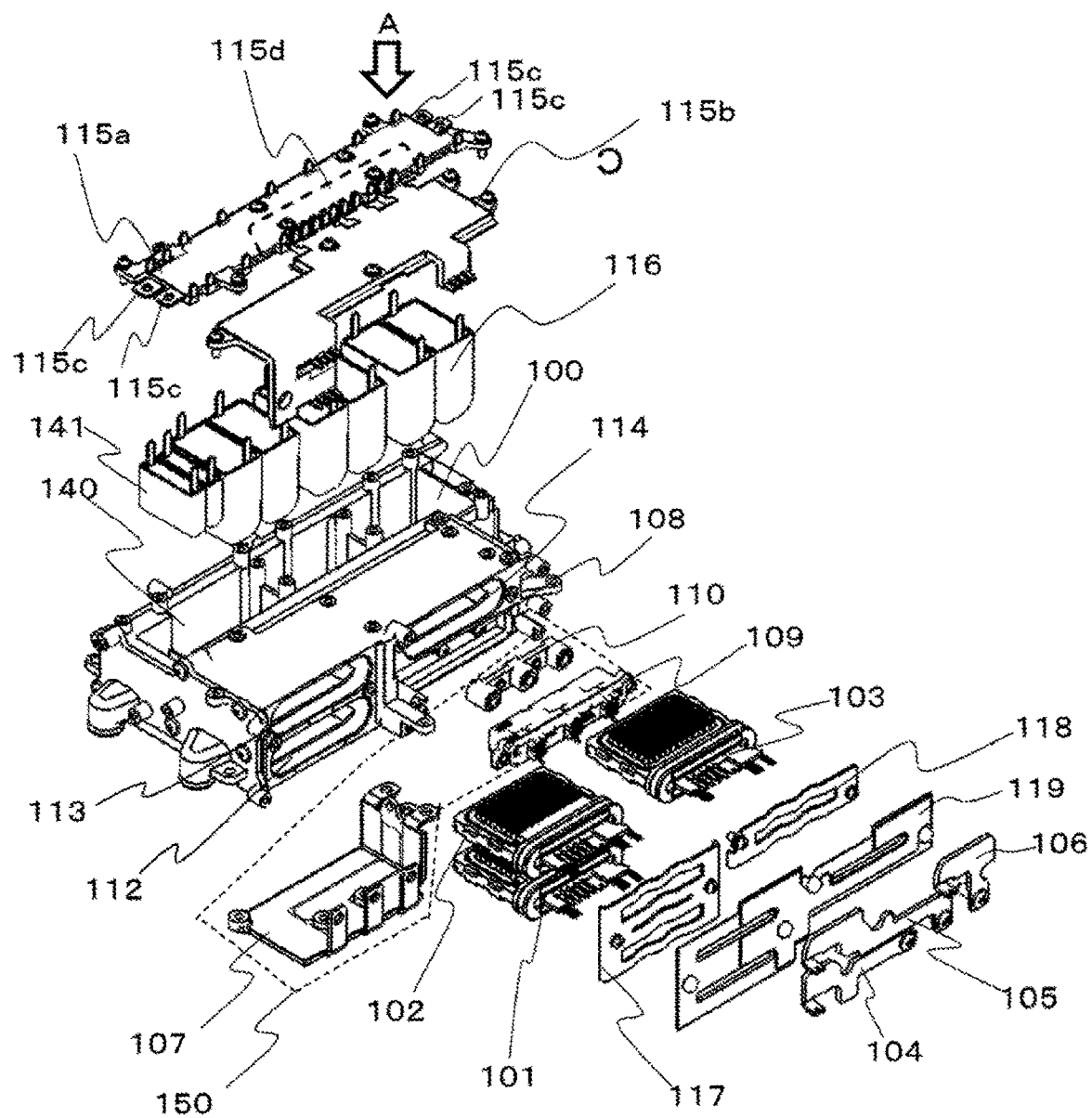
FIG. 3 is an exploded perspective view of the internal components of the electric power conversion device according to the present embodiment.
Figure 4:
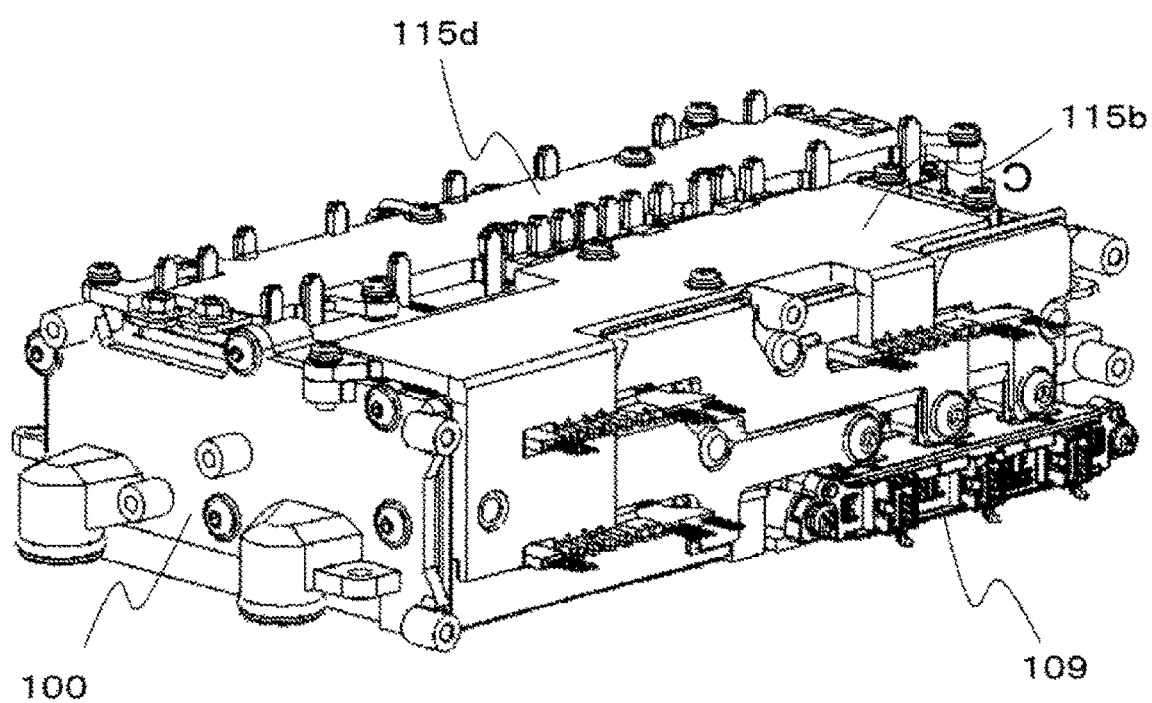
FIG. 4 is a perspective view of the internal components of the electric power conversion device illustrated in FIG. 3.

FIG. 1 is an exploded perspective view related to an AC circuit body 150, a first AC relay bus bar 104, a second AC relay bus bar 105, a third AC relay bus bar 106, and other components among internal components of an electric power conversion device according to a present embodiment. FIG. 2 is a perspective view of the internal components of the electric power conversion device illustrated in FIG. 1. FIG. 3 is an exploded perspective view of the internal components of the electric power conversion device according to the present embodiment. FIG. 4 is a perspective view of the internal components of the electric power conversion device illustrated in FIG. 3.

As illustrated in FIG. 3, as an inverter circuit, a first power semiconductor module 101, a second power semiconductor module 102, and a third power semiconductor module 103 are provided. For example, the first power semiconductor module 101 includes multiple switching devices configuring the upper arm and the lower arm of the U-phase of the inverter circuit, for outputting the U-phase AC current. Similarly, the second power semiconductor module 102 includes multiple switching devices configuring the upper arm and the lower arm of the V-phase of the inverter circuit, for outputting the V-phase AC current. The third power semiconductor module 103 includes multiple switching devices configuring the upper arm and the lower arm of the W-phase of the inverter circuit, for outputting the W-phase AC current.

Figure 5:
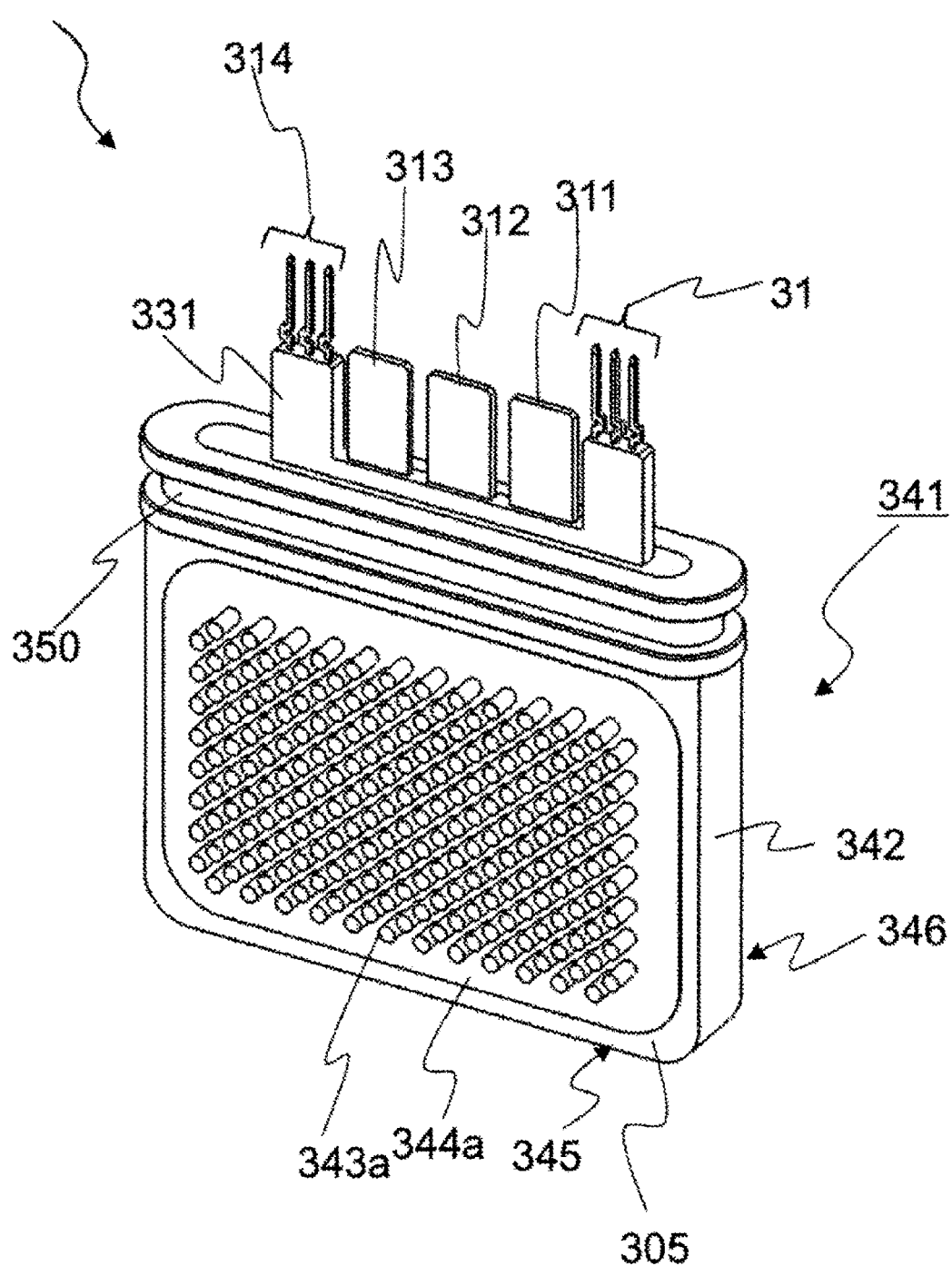
FIG. 5 is an exterior perspective view of a first power semiconductor module 101.

FIG. 5 is an exterior perspective view of the first power semiconductor module 101. The first power semiconductor module 101 inputs and outputs DC power through a positive electrode terminal 311 and a negative electrode terminal 312. An AC terminal 313 outputs AC power. Signal terminals 314 and 315 receive control signals from a driver circuit.

Sealing resin 331 seals a portion of the positive electrode terminal 311, a portion of the negative electrode terminal 312, a portion of each of the signal terminals 314 and 315, and the switching devices. A case 341 accommodates a portion of the sealing resin 331.

The case 341 includes: a first heat radiation base portion 344a on which a first fin 343a is formed; a second heat radiation base portion 344b that is disposed to face the first heat radiation base portion 344a and on which a second fin 343b is formed; and a frame 342 connecting the first heat radiation base portion 344a and the second heat radiation base portion 344b together. The frame 342 is connected to the first heat radiation base portion 344a via a bonding portion 305. The second heat radiation base portion 344b is connected to the frame 342 similarly.

The first fin 343a and the second fin 343b, and the first heat radiation base portion 344a and the second heat radiation base portion 344b are preferably formed of material with good heat conduction, and are formed of pure aluminum material, pure copper, copper alloy, or the like. The frame 342 is preferably formed of material that is easily produced and has rigidity, and is formed of aluminum die-casting material, duralumin, or the like. The bonding portion 305 is bonded with FSW or brazing, and seals the frame 342 and the first heat radiation base portion 344a, and seals the frame 342 and the second heat radiation base portion 344b. Incidentally, the seal here may be an O-ring or an adhesive.

Figure 6:
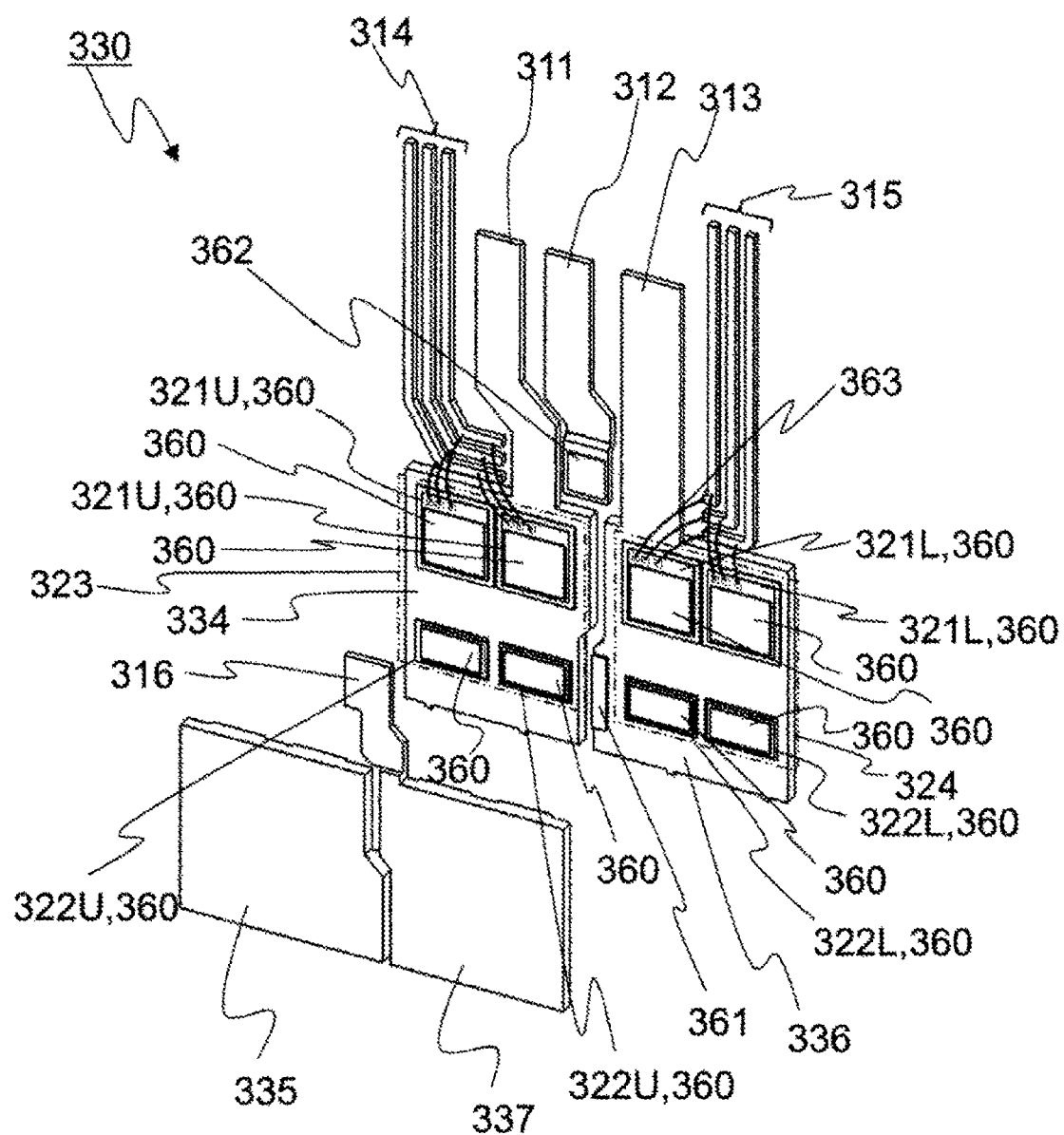
FIG. 6 is an exploded perspective view of a circuit body 330 excluding sealing resin 331.

FIG. 6 is an exploded perspective view of a circuit body 330 excluding the sealing resin 331. The circuit body 330 configures the upper arm and the lower arm of the inverter circuit, and includes an upper arm side semiconductor device 323 and a lower arm side semiconductor device 324.

The upper arm side semiconductor device 323 is configured with an IGBT 321U and a diode 322U. The IGBT 321U and the diode 322U are connected to a positive electrode side conductive plate 334 and a first intermediate conductive plate 335 via solder 360.

The IGBT 321U is connected to the signal terminals 314 via bonding wires 363, and receives the control signals from the driver circuit via the signal terminals 314.

The lower arm side semiconductor device 324 is configured with an IGBT 321L and a diode 322L. The IGBT 321L and the diode 322L are connected to a second intermediate conductive plate 336 and a negative electrode side conductive plate 337 via the solder 360.

The IGBT 321L is connected to the signal terminals 315 via the bonding wires 363, and receives the control signals from the driver circuit via the signal terminals 315.

For the IGBT 321U and the IGBT 321L, a metal oxide semiconductor field effect transistor (hereinafter referred to as a MOSFET for short) may be used.

The first intermediate conductive plate 335 is connected to the second intermediate conductive plate 336 via the solder 361. The negative electrode side conductive plate 337 includes an intermediate DC negative electrode terminal 316. The intermediate DC negative electrode terminal 316 is connected to the negative electrode terminal 312 via the solder 362.

The positive electrode side conductive plate 334 is connected to the positive electrode terminal 311. The second intermediate conductive plate 336 is connected to the AC terminal 313. The AC terminal 313 may be formed on the first intermediate conductive plate 335. The positive electrode side conductive plate 334, the first intermediate conductive plate 335, the second intermediate conductive plate 336, and the negative electrode side conductive plate 337 are formed of copper or the like.

As illustrated in FIG. 3, the AC circuit body 150 is configured with an AC bus bar 107, a current sensor 109, and a terminal block 110. The AC bus bar 107 is connected to each of the first AC relay bus bar 104, the second AC relay bus bar 105, and the third AC relay bus bar 106. The terminal block 110 is disposed at a position facing a bonding portion of the AC bus bar 107 with the first AC relay bus bar 104 and the like, and receives stress at the time of connection and transmits heat of the bonding portion to a flow path forming body 100 described later. The current sensor 109 is configured to penetrate the AC bus bar 107.

The flow path forming body 100 forms a first accommodation portion 112 for accommodating the first power semiconductor module 101, a second accommodation portion 113 for accommodating the second power semiconductor module 102, and a third accommodation portion 114 for accommodating the third power semiconductor module 103. In the present embodiment, the first accommodation portion 112, the second accommodation portion 113, and the third accommodation portion 114 also serves as a flow path space through which a refrigerant flows; however, piping through which the refrigerant flows may be brought into contact with the first accommodation portion 112.

A first pressing plate 117 presses the first power semiconductor module 101 and the second power semiconductor module 102 against the flow path forming body 100. A second pressing plate 118 presses the third power semiconductor module 103 against the flow path forming body 100.

An insulating member 119 is disposed between a space in which the first pressing plate 117 and the second pressing plate 118 are disposed and a space in which the first AC relay bus bar 104, the second AC relay bus bar 105, and the third AC relay bus bar 106 are disposed. The insulating member 119 has a function of insulating the first pressing plate 117 and the like from the first AC relay bus bar 104 and the like, and has a function of transmitting heat generated in the first AC relay bus bar 104 and the like to the flow path forming body 100 via the first pressing plate 117 and the like.

A capacitor 116 for smoothing DC power is accommodated in a capacitor accommodation portion 140 formed in the flow path forming body 100.

A first DC bus bar 115a is connected to the capacitor 116. The first DC bus bar 115a in the present embodiment is configured with a positive electrode side bus bar, a negative electrode side bus bar, and an insulating layer disposed between the positive electrode side bus bar and the negative electrode side bus bar.

A second DC bus bar 115b is connected to the first DC bus bar 115a, the first power semiconductor module 101, and the like. Similarly to the first DC bus bar 115a, the second DC bus bar 115b in the present embodiment is configured with a positive electrode side bus bar, a negative electrode side bus bar, and an insulating layer disposed between the positive electrode side bus bar and the negative electrode side bus bar.

A bonding portion 115d is configured with a terminal of the first DC bus bar 115a and a terminal of the second DC bus bar 115b. This bonding portion 115, when viewed from a direction of an arrow A, is formed in a width smaller than a width of the first DC bus bar 115a and a width of the second DC bus bar 115b. Thus, a return current during switching flowing between the first power semiconductor module 101, the second power semiconductor module 102, and the third power semiconductor module 103 easily flows to the second DC bus bar 115b. In addition, it is possible to inhibit switching noise of the first power semiconductor module 101 and the like from mixing into a noise reduction capacitor 141 for reducing noise from a power supply terminal 115c.

In addition, the DC bus bar is divided into the two DC bus bars, the first DC bus bar 115a and the second DC bus bar 115b, and the two DC bus bars are connected to each other via the bonding portion 115d, so that it becomes easier to absorb connection tolerance from the capacitor 116 to the first power semiconductor module 101 and the like.

When the three power semiconductor modules are arranged in a line, a longitudinal dimension for the three power semiconductor modules is reflected in a size of a housing of the electric power conversion device, so that a size in a predetermined direction of the electric power conversion device increases and arrangement efficiency decreases, which may lead to a size increase of the electric power conversion device as a result.

Therefore, in the present embodiment, as illustrated in FIG. 1 and FIG. 2, in a case where a direction along an arrangement direction of the first power semiconductor module 101 and the second power semiconductor module 102 is defined as a first column 151, the third power semiconductor module 103 and the AC circuit body 150 are disposed along a second column 152 being in a direction parallel to the first column 151. In addition, the AC circuit body 150 is disposed in a space 108 that is in a direction orthogonal to the first column 151 and faces the second power semiconductor module 102, and is in a direction parallel to the second column 152 and faces the third power semiconductor module 103.

Thus, miniaturization can be achieved of the longitudinal direction and height direction of the electric power conversion device. In addition, wiring distances to the AC circuit body 150 from the first power semiconductor module 101, the second power semiconductor module 102, and the third power semiconductor module 103 tend to be made uniform, and wiring efficiency of AC wiring is improved, and miniaturization of the electric power conversion device is achieved. In addition, the wiring efficiency of the AC wiring is improved, whereby reduction of an amount of heat of the AC wiring can be achieved.

In addition, the flow path forming body 100 according to the present embodiment forms the first accommodation portion 112 for accommodating the first power semiconductor module 101 such that the first power semiconductor module 101 is sandwiched by flow paths, the second accommodation portion 113 for accommodating the second power semiconductor module 102 such that second power semiconductor module 102 is sandwiched by flow paths, and the third accommodation portion 114 for accommodating the third power semiconductor module 103 such that the third power semiconductor module 103 is sandwiched by flow paths. Thus, the AC circuit body 150 is disposed in a position surrounded by the first accommodation portion 112, the second accommodation portion 113, and the third accommodation portion 114, so that cooling performance of the AC circuit body 150 can be significantly improved.

In particular, the current sensor 109 among components configuring the AC circuit body 150 is required to be protected preferentially from a heat source, so that the current sensor 109 is disposed in the position surrounded by the first accommodation portion 112, the second accommodation portion 113, and the third accommodation portion 114. In addition, to increase thermal contact to the flow path forming body 100, the AC bus bar 107 is bent so as to extend along from a predetermined surface to another surface of the flow path forming body 100. A portion of the AC bus bar 107 protrudes from the position surrounded by the first accommodation portion 112, the second accommodation portion 113, and the third accommodation portion 114 to form a terminal.

REFERENCE SIGNS LIST 100 flow path forming body
101 first power semiconductor module
102 second power semiconductor module
103 third power semiconductor module
104 first AC relay bus bar
105 second AC relay bus bar
106 third AC relay bus bar
107 AC bus bar
108 space
109 current sensor
110 terminal block
112 first accommodation portion
113 second accommodation portion
114 third accommodation portion
115a first DC bus bar
115b second DC bus bar
115d bonding portion
116 capacitor
117 first pressing plate
118 second pressing plate
119 insulating member
140 capacitor accommodation portion 140
141 noise reduction capacitor
150 AC circuit body
151 first column
152 second column
305 bonding portion
311 positive electrode terminal
312 negative electrode terminal
313 AC terminal
314 signal terminal
315 signal terminal
316 intermediate DC negative electrode terminal
321L IGBT
321U IGBT
322L diode
322U diode
323 upper arm side semiconductor device
324 lower arm side semiconductor device
330 circuit body
331 sealing resin
333 insulating sheet
334 positive electrode side conductive plate
335 first intermediate conductive plate
336 second intermediate conductive plate
337 negative electrode side conductive plate
341 case
342 frame
343a first fin
343b second fin
344a first heat radiation base portion
344b second heat radiation base portion
350 sealing portion
351 sealing member
360 solder 361 solder
362 solder
363 bonding wire

The invention claimed is:

1. An electric power conversion device comprising:
three power semiconductor modules that output U-phase, V-phase, and W-phase AC currents, respectively; and
an AC circuit body that transmits and detects the AC currents, wherein
the three power semiconductor modules and the AC circuit body are disposed on respective four regions partitioned by two rows and two columns, wherein
the three power semiconductor modules are configured with a first power semiconductor module that outputs a U-phase AC current, a second power semiconductor module that outputs a V-phase AC current, and a third power semiconductor module that outputs a W-phase AC current,
the AC circuit body transmits and detects the U-phase AC current, the V-phase AC current, and the W-phase AC current, and
when a direction along an arrangement direction of the first power semiconductor module and the second power semiconductor module is defined as a first column,
the third power semiconductor module and the AC circuit body are disposed along a second column being in a direction parallel to the first column, and
the AC circuit body is disposed in a space that is in a direction orthogonal to the first column and faces the second power semiconductor module, and is in a direction parallel to the second column and faces the third power semiconductor module.

2. The electric power conversion device according to claim 1, further comprising
a flow path forming body that forms flow paths through which a refrigerant flows, wherein
the flow path forming body forms a first accommodation portion for accommodating the first power semiconductor module such that the first power semiconductor module is sandwiched by the flow paths, a second accommodation portion for accommodating the second power semiconductor module such that the second power semiconductor module is sandwiched by the flow paths, and a third accommodation portion for accommodating the third power semiconductor module such that the third power semiconductor module is sandwiched by the flow paths.

3. The electric power conversion device according to claim 1, wherein
the AC circuit body is configured with a current sensor that detects at least two of the U-phase AC current, the V-phase AC current, and the W-phase AC current, and a terminal block that supports an AC bus bar for transmitting the U-phase AC current, the V-phase AC current, and the W-phase AC current.

* * * * *